US008923065B2

(12) United States Patent
Ramachandra (10) Patent No.: US 8,923,065 B2
(45) Date of Patent: Dec. 30, 2014

(54) NONVOLATILE MEMORY AND METHOD WITH IMPROVED I/O INTERFACE

(71) Applicant: SanDisk Technologies Inc., Plano, TX (US)

(72) Inventor: Venkatesh Prasad Ramachandra, San Jose, CA (US)

(73) Assignee: SanDisk Technologies, Inc., Plano, TX (US)

( * ) Notice: Subject to any disclaimer, the term of this patent is extended or adjusted under 35 U.S.C. 154(b) by 15 days.

(21) Appl. No.: 13/801,142

(22) Filed: Mar. 13, 2013

(65) Prior Publication Data

US 2014/0185374 A1 Jul. 3, 2014

Related U.S. Application Data

(60) Provisional application No. 61/747,893, filed on Dec. 31, 2012.

(51) Int. Cl.
*G11C 11/34* (2006.01)
*G11C 7/22* (2006.01)
*G11C 8/10* (2006.01)
*G11C 16/06* (2006.01)

(52) U.S. Cl.
CPC .............. *G11C 16/06* (2013.01); *G11C 7/227* (2013.01); *G11C 8/10* (2013.01); *G11C 2207/005* (2013.01)
USPC ...................................................... 365/185.2

(58) Field of Classification Search
CPC ..... G11C 5/147; G11C 7/1069; G11C 29/022
USPC ...................................................... 365/185.2
See application file for complete search history.

(56) References Cited

U.S. PATENT DOCUMENTS

| | | | |
|---|---|---|---|
| 5,070,032 A | 12/1991 | Yuan et al. | |
| 5,095,344 A | 3/1992 | Harari | |
| 5,313,421 A | 5/1994 | Guterman et al. | |
| 5,315,541 A | 5/1994 | Harari et al. | |

(Continued)

FOREIGN PATENT DOCUMENTS

WO    WO 2009/014796    1/2009

OTHER PUBLICATIONS

Notification of Transmittal of the International Search Report and the Written Opinion of the International Searching Authority, or the Declaration, mailed on Jun. 6, 2014, 10 pages.

(Continued)

*Primary Examiner* — Anthan Tran
(74) *Attorney, Agent, or Firm* — Davis Wright Tremaine LLP (57) ABSTRACT

Each I/O channel between a controller and one or more memory dice of a memory device has a driver on one end and a receiver at the other end. The receiver is optionally terminated with a pseudo open-drain ("POD") termination instead of the conventional center-tapped ("CTT") termination to save energy. During a read operation, data is driven from the memory die to a POD terminated receiver circuit in the controller. With POD termination, the degradation in performance due to the more non-linear driver in the memory die, fabricated for example in the NAND technology processing, is alleviated by an adaptive reference voltage level adjustment in the receiver circuit of the controller. Optionally, the receiver circuit of a memory die is also provided with an adaptive reference level adjustment.

28 Claims, 11 Drawing Sheets

(56) References Cited

U.S. PATENT DOCUMENTS

| | | |
|---|---|---|
| 5,343,063 A | 8/1994 | Yuan et al. |
| 5,570,315 A | 10/1996 | Tanaka et al. |
| 5,661,053 A | 8/1997 | Yuan |
| 5,768,192 A | 6/1998 | Eitan |
| 5,903,495 A | 5/1999 | Takeuchi et al. |
| 6,011,725 A | 1/2000 | Eitan |
| 6,046,935 A | 4/2000 | Takeuchi et al. |
| 6,222,762 B1 | 4/2001 | Guterman et al. |
| 2006/0092715 A1 | 5/2006 | Braun et al. |
| 2006/0119380 A1* | 6/2006 | Gonzalez ................. 326/30 |
| 2007/0285121 A1 | 12/2007 | Park et al. |
| 2008/0162778 A1 | 7/2008 | Choi et al. |
| 2010/0202227 A1* | 8/2010 | Nguyen et al. ............ 365/198 |
| 2012/0113732 A1 | 5/2012 | Sohn et al. |

OTHER PUBLICATIONS

Eitan et al., "NROM: A Novel Localized Trapping, 2-Bit Nonvolatile Memory Cell" IEEE Electron Device Letters, 2000, 21: (11) 543-545.

\* cited by examiner

Pseudo Open Drain Termination (POD) with NON-LINEAR NAND DIE Driver

Adaptive Vref on Memory Die being set via the Device Bus by command/data sent the Memory Controller

NONVOLATILE MEMORY AND METHOD WITH IMPROVED I/O INTERFACE

CROSS-REFERENCE TO RELATED APPLICATIONS

The benefit is claimed of U.S provisional patent application of Venkatesh Prasad Ramachandra, Application No. 61/747,893 filed on Dec. 31, 2012.

BACKGROUND

This application relates to the operation of re-programmable non-volatile memory systems such as semiconductor flash memory, and, more specifically, to improvements of the input/output performance and power efficiency in a multi-die operating environment.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retaining its stored data even after power is turned off. Also, unlike ROM (read only memory), flash memory is rewritable similar to a disk storage device. In spite of the higher cost, flash memory is increasingly being used in mass storage applications. More recently, flash memory in the form of solid-state disks ("SSD") is beginning to replace hard disks in portable computers as well as in fixed location installations. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card or SSD are ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Current commercial products configure each storage element of a flash EEPROM array to store either a single bit of data or more than a single bit of data. A single-level-cell (SLC) memory has each cell storing a single bit of data by operating in a binary mode, where a single reference level differentiates between two ranges of threshold levels of each storage element.

The threshold levels of transistors correspond to ranges of charge levels stored on their storage elements. In addition to shrinking the size of the memory arrays, the trend is to further increase the density of data storage of such memory arrays by storing more than one bit of data in each storage element transistor. A multi-level-cell (MLC) memory has each cell storing more a single bit of data by operating in a multi-level mode, where two or more reference levels differentiates between more than two ranges of threshold levels of each storage element. For example, commercial flash memory products now operate in four states (2 bits of data per storage element) or eight states (3 bits of data per storage element) or 16 states per storage element (4 bits of data per storage element). Each storage element memory transistor has a certain total range (window) of threshold voltages in which it may practically be operated, and that range is divided into the number of states defined for it plus margins between the states to allow for them to be clearly differentiated from one another. Obviously, the more bits a memory cell is configured to store, the smaller is the margin of error it has to operate in.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeable with more common terms such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing. More recently, the memory devices in the form of SSD are being offered commercially in the form factor of a standard hard drive.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Memory Chip's I/O Performance

High performance integrated-circuit memory devices typically have multiple dice or chips controlled by a memory controller. Each die contains a memory array with peripheral circuits. At any one time, many of these multiple dice may be involved in various memory operations including input or output operations with the memory controller. For example, in enterprise SSD (Solid-State Disk) and Client SSD the input/output ("I/O") requirements are demanding. Typically there are 8 to 16 dice stacked on same I/O channel and they are operating at 200 MHz (DDR2) speed with reduced power.

One issue has to do with the proper termination of the I/O channel. At the microwave operating frequencies, the I/O channel behaves like a transmission line and improper impedance match or termination will lead to reflections. The reflections will degrade the transmission speed.

Currently, high density flash memories are flash EEPROM arranged in the NAND architecture. Implementing DDR2 features in NAND flash is problematic and has limitations. For example, a large load capacitance, Cload cap, cannot be driven at 200 MHZ without ODT (On-Die Termination). ODT supported on current NAND I/O is CCT (Center-Tap Termination), which is very costly in power.

Thus, there is a need to provide a high performance and low power I/O channel between a nonvolatile memory and a memory controller.

SUMMARY OF THE INVENTION

Each I/O channel between a controller and one or more memory dice of a memory device has a driver on one end and a receiver at the other end. The receiver is optionally terminated with a pseudo open-drain ("POD") termination instead of the conventional center-tapped ("CTT") termination to save energy. During a read operation, data is driven from the memory die to a POD terminated receiver circuit in the controller. With POD termination, the degradation in performance due to the more non-linear driver in the memory die, fabricated for example in the NAND technology processing, is alleviated by an adaptive reference voltage adjustment in the receiver circuit of the controller. Optionally, the receiver circuit of a memory die is also provided with an adaptive reference voltage level adjustment.

According to one embodiment of the invention, the receiver circuit is configured with the POD termination having only a first termination resistor ("Rtt") shunting the channel to a supply voltage ("VDD") while leaving an open circuit to ground. The receiver circuit is supplied with an adaptively adjusted reference voltage to renormalize the resultant asymmetric signal in the I/O due to the non-linear driver and POD termination combination.

The adaptively adjusted reference level is dependent on a ratio given by Rtt/Ron when the driver has a resistance Ron. In particular, when the reference level for a CTT termination is Vccq/2, the adaptively adjusted reference voltage for POD deviate from Vccq/2 by $\Delta V$, where $\Delta V=[Ron/(Ron+Rtt)]$ Vccq/2.

According to another embodiment of the invention, the memory device includes an adaptive reference level generator for providing the adjusted reference voltage to the receiver circuit.

According to another embodiment of the invention, each receiver circuit in the memory device is supplied with an adaptively adjusted reference voltage.

According to another embodiment of the invention, the receiver circuit is controllable to be operating in either CTT termination or POD termination.

According to another embodiment of the invention, the data through the I/O channel is encoded to minimize a bit value that consumes energy in the POD termination.

According to another embodiment of the invention, the adaptive reference level generator is set by the controller at power-up of the memory device based on test runs of the I/O channel.

Various aspects, advantages, features and details of the innovative three-dimensional variable resistive element memory system are included in a description of exemplary examples thereof that follows, which description should be taken in conjunction with the accompanying drawings.

All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DESCRIPTION OF EXEMPLARY EMBODIMENTS

Memory System

Figure 1:
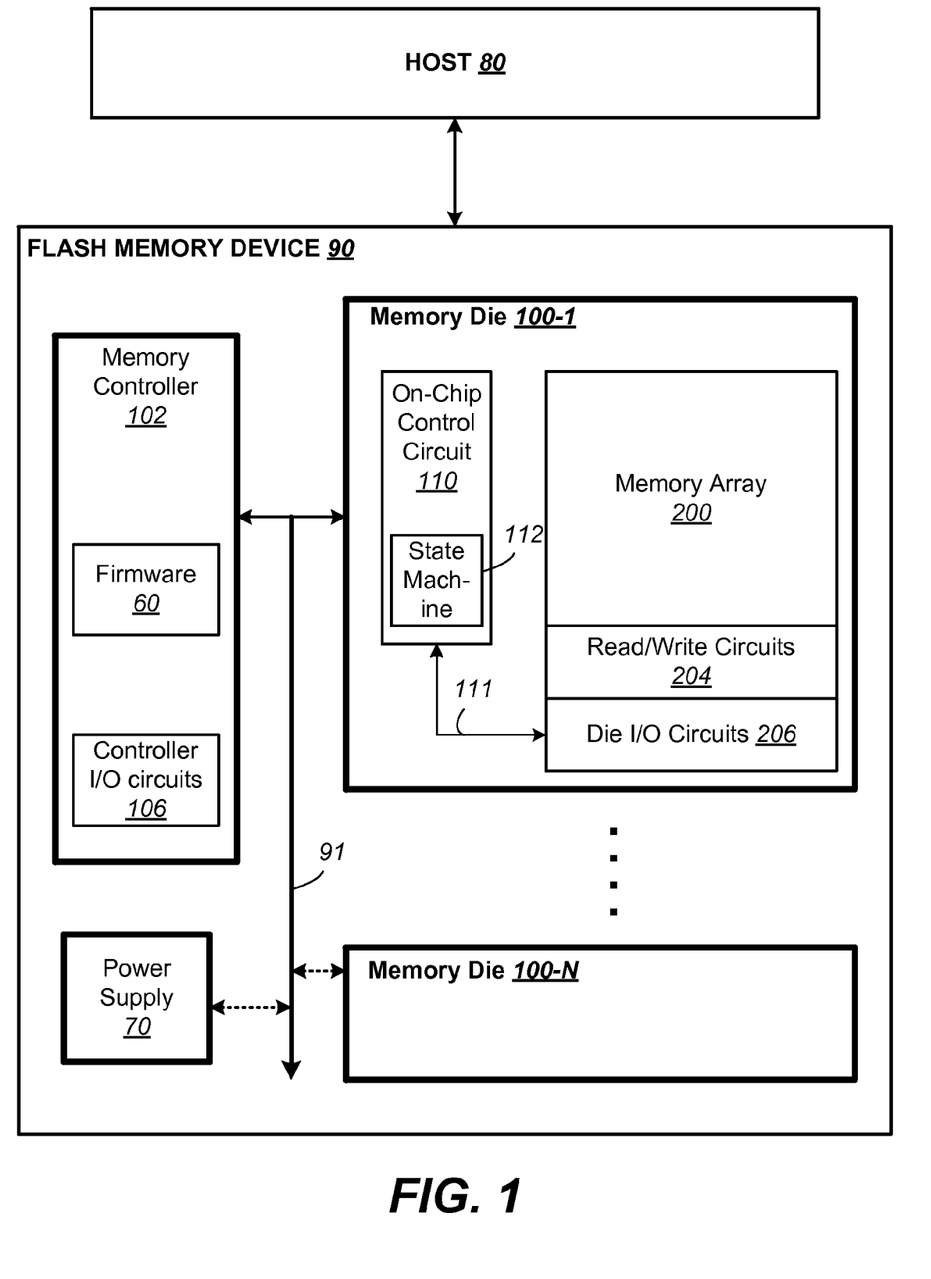
FIG. 1 illustrates a host in communication with a memory device in which the features of the present invention are embodied.

FIG. 1 illustrates a host in communication with a memory device in which the features of the present invention are embodied. The host 80 typically sends data to be stored at the memory device 90 or retrieves data by reading the memory device 90. The memory device 90 includes one or more memory die or chip 100 managed by a memory controller 102. The memory controller 102 is typically implemented as another chip with CMOS circuit elements. FIG. 1 shows, for example, the memory device having N dice, such as memory die 100-1, . . . , memory die 100-N. The memory device 90 is powered by a power supply 70 that has a predetermined maximum capacity.

The memory die 100 includes a memory array 200 of memory cells. The memory cells are typically flash EEPROM arranged in the NAND architecture. Each cell is capable of being configured as a multi-level cell ("MLC") for storing multiple bits of data, as well as capable of being configured as a single-level cell ("SLC") for storing 1 bit of data. The memory die also includes peripheral circuits such as row and column decoders (not shown), read/write circuits 204 and die I/O circuits 206. An on-chip control circuitry 110 controls low-level memory operations of each die. The control circuitry 110 is an on-chip controller that cooperates with the peripheral circuits to perform memory operations on the memory array 200. The control circuitry 110 includes a state machine 112 to provide die or chip level control of low-level memory operations via an internal bus 111 for carrying control signals, data and addresses.

In many implementations, the host 80 communicates and interacts with the memory chip 100 via the memory controller 102. The memory controller 102 co-operates with the memory chip and controls and manages higher level memory operations. A firmware 60 provides codes to implement the functions of the controller 102.

For example, in a host write, the host 10 sends data to be written to the memory array 100 in logical sectors allocated from a file system of the host's operating system. A memory block management system implemented in the controller stages the sectors and maps and stores them to the physical structure of the memory array. A preferred block management system is disclosed in United States Patent Application Publication Number: US-2010-0172180-A1, the entire disclosure of which is incorporated herein by reference.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. Preferably, all memory elements of a page are read or programmed together.

A memory device bus 91 provides communications and power between the memory controller 102, the power supply 70 and the one or more memory die 100. An I/O channel is established between the memory controller and each of one or more memory die via the device bus 91 and internal bus 111. Each I/O channel has a controller I/O circuit 106 and one of the one or more die's I/O circuits 206 as endpoints.

I/O Between Memory Die and Memory Controller

Figure 2:
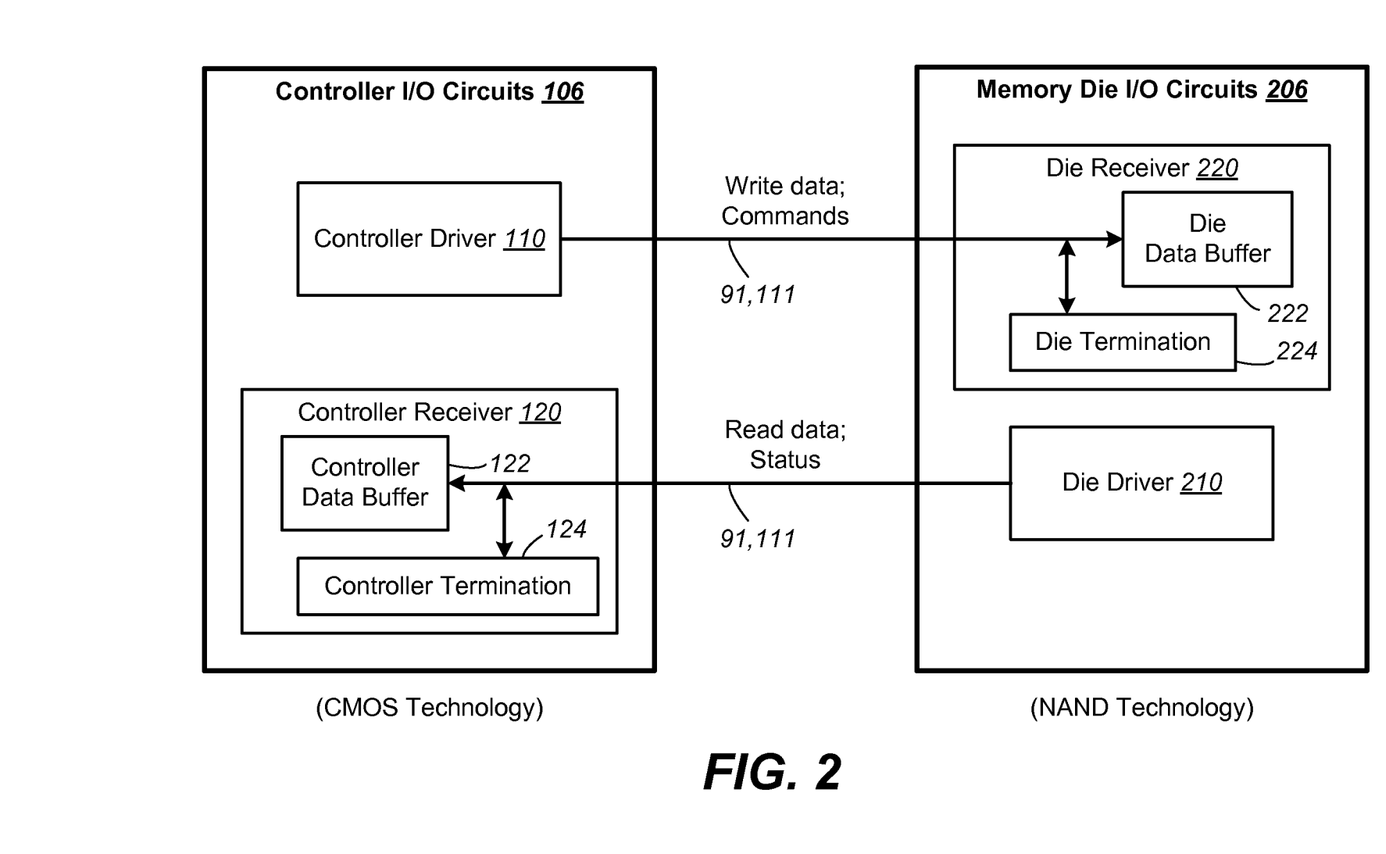
FIG. 2 illustrates an I/O channel established between a memory die and the memory controller.

FIG. 2 illustrates an I/O channel established between a memory die and the memory controller. Both the memory die 206 and the memory controller 106 contain I/O circuits. Each I/O circuits include a driver and a receiver. The controller I/O circuits 106 include a controller driver 110 and a controller receiver 120. The controller receiver 120 includes a controller data buffer 130 and a controller termination 140. The die I/O circuits 206 include a die driver 210 and a die receiver 220. The die receiver 220 includes a die data buffer 230 and a die termination 240.

When the memory controller 106 is sending data or commands to the memory die 206 such as in a write operation, the data is being driven by the controller driver 110 via the device bus to the die receiver 220. When the memory die is sending data or status to the memory controller such as in a read operation, the data is being driven by the die driver 210 via the device bus to the controller receiver 120.

As mentioned in an earlier section, one issue has to do with the proper termination of the I/O channel. At the microwave operating frequencies, the I/O channel behaves like a transmission line and improper impedance match or termination will lead to reflections. The reflections will degrade the transmission speed. Generally, two types of termination are possible. One is a Center-Tap Termination (CTT) which consumes more power. The other one is a Pseudo Open Drain Termination (POD) which consumes less power but has other issues.

Figure 3:
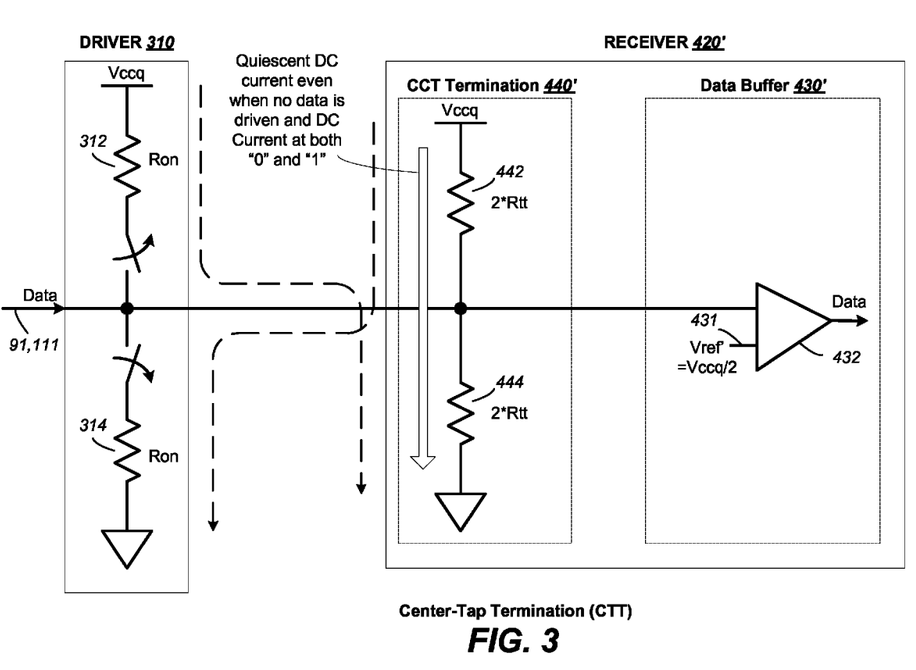
FIG. 3 illustrates a conventional Center-Tap Termination (CTT) for an I/O channel.

FIG. 3 illustrates a conventional Center-Tap Termination (CTT) for an I/O channel. The I/O channel allows a data stream to be driven by a driver 310 and transmitted through the device bus 300 to a receiver 420' with CTT. The driver 310 is implemented by a pair of transistors 312, 314 driving in a complementary mode. The effective resistance for each of the transistors is Ron. At the receiver 420' side, the signal from the driver 310 is input to a data buffer 430' while being terminated by a CCT termination circuit 440'. The CCT termination 440' provides a termination impedance of Rtt by having an input line 311 center-taps a resistor network formed by two resistors 442, 444 in series across a power supply Vccq and ground. Each resistor has a value 2*Rtt. The driven data is between Vccq and 0 v, therefore the data buffer 430' working with the CTT termination has its reference Vref set to Vccq/2 and provides equal signal strength for both "0"s and "1"s. The CCT termination wastes power as it can be seen that the current Iccq flowing in the power supply has a DC component whenever the data is "0" or "1". (An AC component is also present but is small and can be neglected.) Furthermore there is also a quiescent DC component flowing in the resistor network in the CCT termination 440' even when no data is driven.

From FIG. 3, the CCT average current Iccq(CTT) is computed to be:

$$Iccq(CCT) = Vccq/[2Rtt + (2Rtt \| Ron)] \quad \text{Equation (1a)}$$
$$= Vccq/[4aRon(1+a)/(2a=1)]$$

where $$a = Rtt/Ron \quad \text{Equation (1b)}$$

is the ratio between the termination and the driver impedance.

Figure 4:
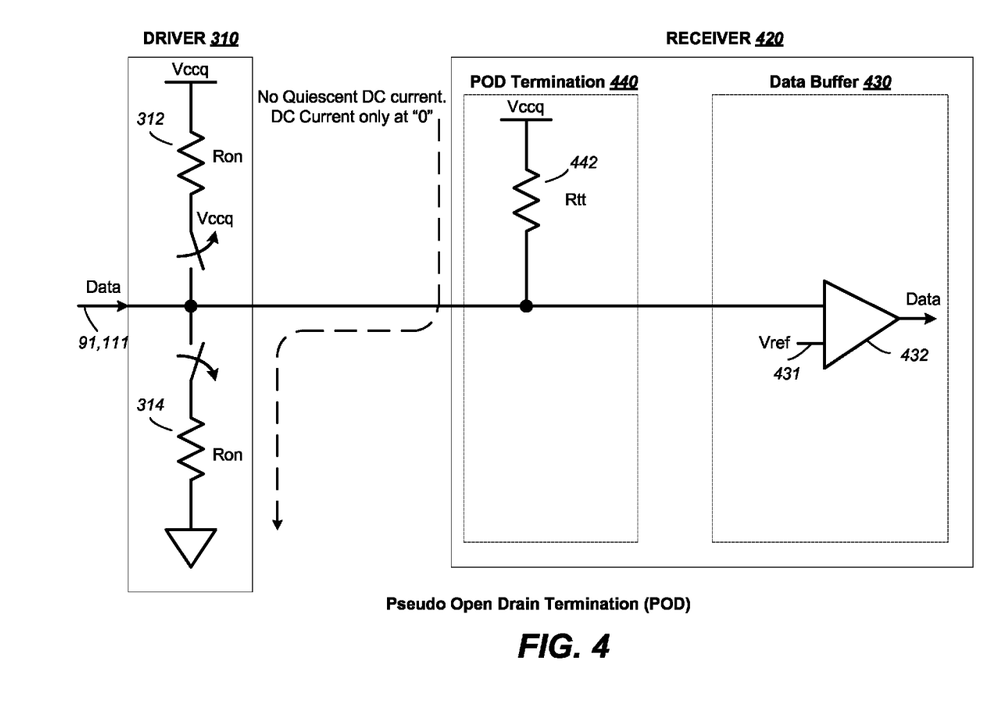
FIG. 4 illustrates a more efficient POD termination for the I/O channel.

FIG. 4 illustrates a more efficient POD termination for the I/O channel. Compared to the CCT termination 440' of FIG. 3, the POD termination 440 omits the resistor stunting the input line 311 to ground and has only one resistor 442 of value Rtt stunting to Vccq. In this way, the quiescent DC component of the Iccq is eliminated when no data is being driven and more importantly, DC current is reduced as current is consumed only for DATA "0". During DATA "1", the output is pulled to Vccq from both driver and receiver side consuming AC current which is small compared to the DC component of the current during DATA "0".

From FIG. 4, the POD average current Iccq(POD) is computed to be:

$$Iccq(POD) = 0.5Vccq/(Rtt+Ron) = Vccq/[2Ron(1+a)] \quad \text{Equation (2)}$$

The reduction of Iccq current from CTT to POD termination is computed from Equations (1a) and (2) to be:

$$\Delta Iccq = [Iccq(CTT) - Iccq(POD)]/Iccq(CTT) = 1/(2a+1) \quad \text{Equation (3)}$$

It can be seen from Equation (3) that the smaller is "a=Rtt/Ron", the more is the power saving. This means that in the POD termination 440, the smaller is Rtt compared to Ron, the less is the swing in POD, so the more is the power saving.

Flash Memory Having I/O Channel with an Adaptive Reference Level in a Pseudo Open Drain (POD) Termination Thus, it is desirable to employ POD termination in an I/O channel as is the case for CMOS DRAM devices. However, for nonvolatile memory like flash NAND memory, CTT terminations are commonly used because POD terminations are not reliable. The reason is that nonlinearity is inherent in driver elements due to limitations of the NAND process technology in the implementation of the I/O circuits.

The issue arises from the output voltage Vo swing of the driver. In CTT in quiescent state the output is always at Vccq/2 due to the resistor divider termination. So the output swing is VoH/VoL=+/−Vccq/2. (VoH/VoL levels depend on termination and driver impedance.) So Vref is normalized to the midlevel of VoH and VoL, viz:

$$Vref = (VoH+VoL)/2. \quad \text{Equation (4)}$$

$$Vref(CTT) = Vccq/2 \quad \text{Equation (5)}$$

For POD terminations, the driver's low output voltage swing is $$VoL(POD) = Vccq*Ron/(Ron+Rtt) = Vccq/(1+a) \quad \text{Equation (6a)}$$

$$VoH(POD) = Vccq \quad \text{Equation (6b)}$$

Therefore from Equation (6a) and (6b):

$$Vref(POD) = [(2+a)/(2+2a)]*Vccq \quad \text{Equation (7)}$$
$$= Vref(CTT) + \Delta V \quad \text{Equation (8a)}$$

Where $\Delta V = [Ron/(Ron+Rtt)]Vccq/2 \quad \text{Equation (8b)}$

Thus, from Equations (5) and (7), it will be seen that for POD terminations, Vref(POD) is dependent on "a=Rtt/Ron", unlike that for CTT terminations. In other words, variation in Rtt/Ron affects Vref(POD).

Figure 5:
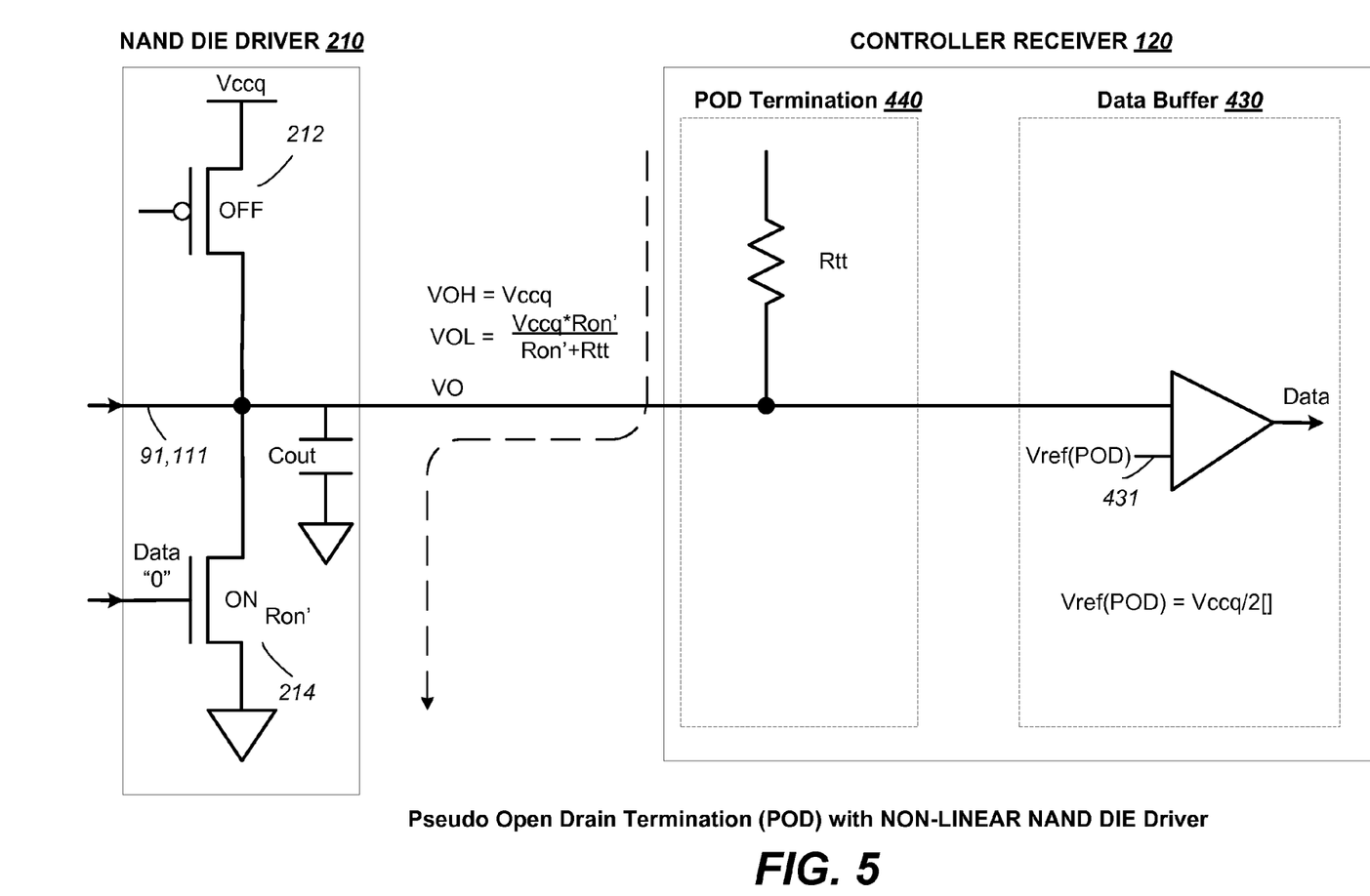
FIG. 5 illustrates the memory die being of the NAND technology and having non-linear driver.

FIG. 5 illustrates the memory die being of the NAND technology and having non-linear driver but being terminated with a POD termination. The driver 210 is implemented by a complimentary pair of transistors 212, 214 fabricated in the NAND technology processing. The output impendence Ron' and therefore a (=Rtt/Ron') does not behave linearly and has large variation with Vccq and temperature. Rtt by memory standards specification has to have less variation and hence needs to be fairly linear by design whereas the specification for Ron allows for larger variation. This means that the driver's low output voltage swing VoL(POD)=Vccq/(1+a) (see Equation (6a)) varies. This is the main limitation to realize POD in current NAND I/O circuits.

Figure 6:
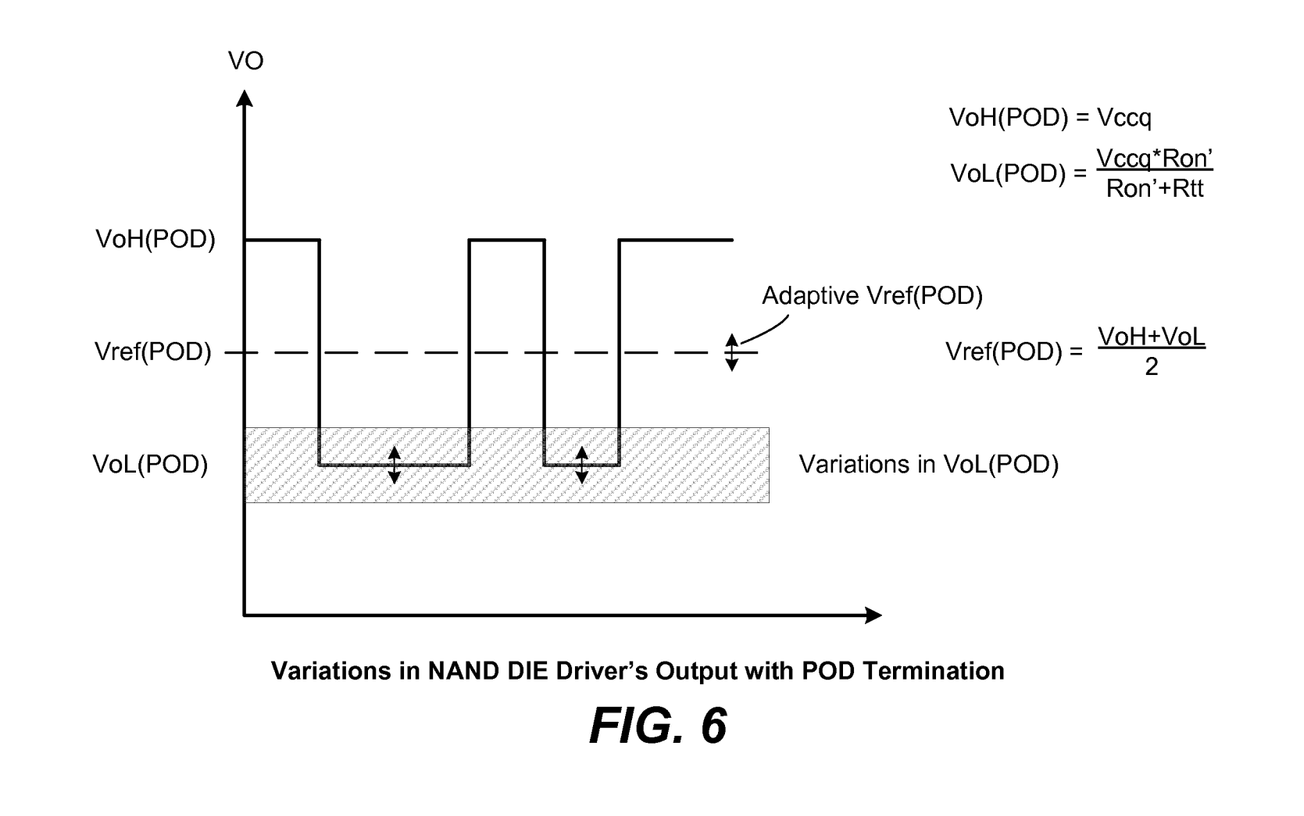
FIG. 6 illustrates the degraded signal in an I/O channel with the non-linear driver and the receiver with POD termination shown in the FIG. 5.

FIG. 6 illustrates the degraded signal in an I/O channel with the non-linear driver and the receiver with POD termination shown in the FIG. 5. The driver's low output voltage swing VoL(POD) assumes values over a range. In particular, when the VoL(POD) is increased, the signal strength for "0"s data are reduced. This will result in poor signal to noise ratio and degradation of the bandwidth of the I/O channel.

In order to employ the power-saving POD termination in the case of NAND's non-linear driver, the reference level of the data buffer 430 in the controller receiver 120, Vref(POD), is adaptively readjusted to be at midlevel between Vccq and VoL(POD), rather than at a fixed level of Vccq/2. The readjustment, ΔV, is dependent on a=Rtt/Ron as shown in Equation (8a) and (8b). It should be noted that if the I/O design of the driver is also linear, adaptive Vref adjustment may be avoided and a fixed value of Vref depending on a=Rtt/Ron can be set.

Figure 7:
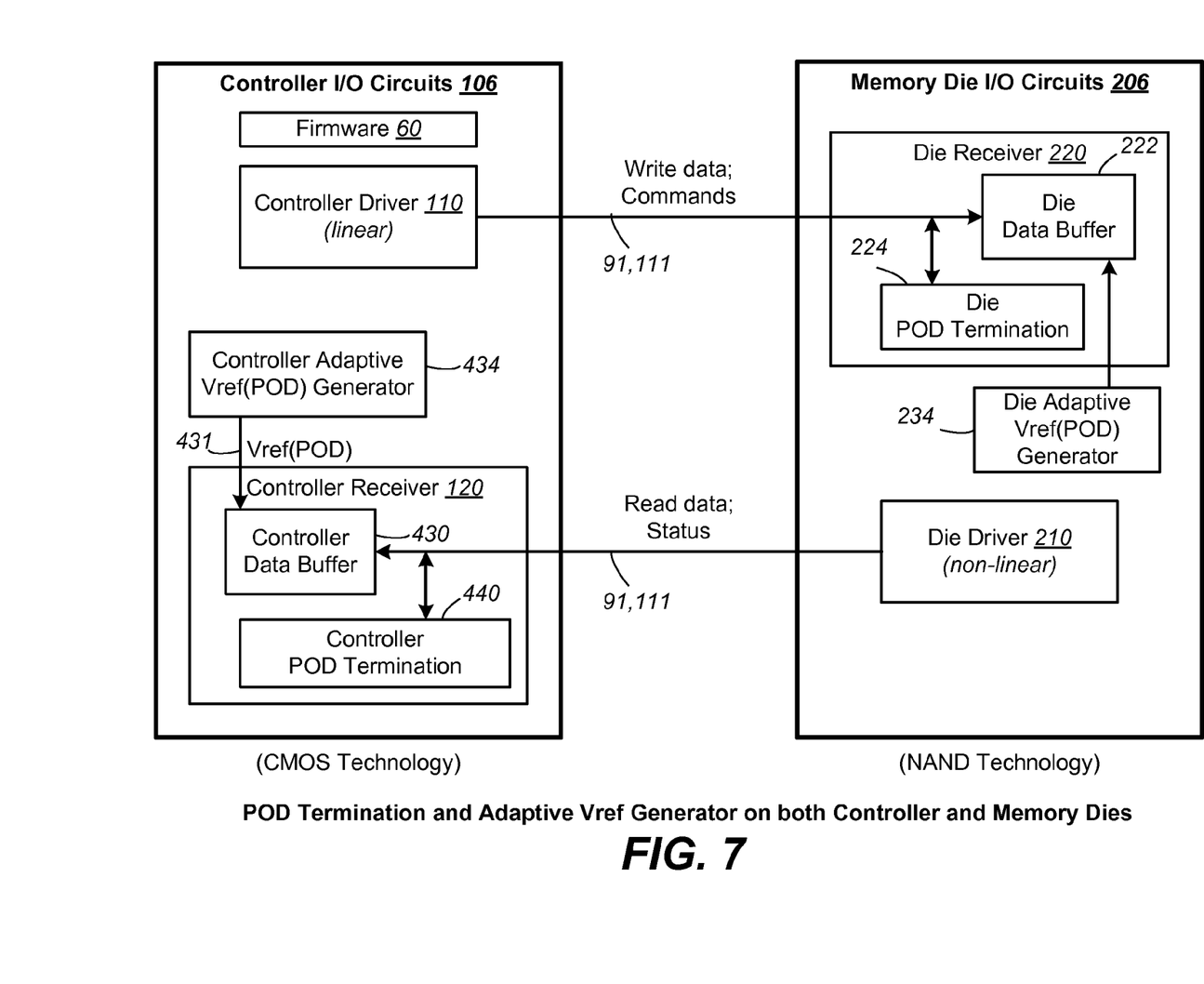
FIG. 7 illustrates a preferred nonvolatile memory device having an I/O channel implemented with power-saving POD terminations despite the nonlinearity inherent in the technology of the memory.

FIG. 7 illustrates one embodiment of a nonvolatile memory device having an I/O channel implemented with power-saving POD terminations despite the nonlinearity inherent in the technology of the memory. FIG. 7 is similar to that illustrated in FIG. 2 except POD terminations are employed in both the controller I/O circuits 106 and the memory die I/O circuits 206. In particular, the embodiment of FIG. 7 provides flexibility in setting individual adaptive Vref generators located in the controller or in the memory dice.

While receiving data from the memory die, an adaptive Vref generator 434 on the memory controller side adjusts Vref to the data buffer 430 of the memory controller's I/O circuits 106. This is required as mentioned earlier that NAND drivers, such as memory die driver 210, have impedance "Ron" that suffers from much variation due to non-linearity. On the other hand, it is assumed that the process technology for the memory controller allows realization of fairly linear output driver impedance "Ron" on the memory controller side in addition to already existing linear termination. This reduces the VoL variation when the memory die is receiving data (as in a write operation) and hence it is possible to employ a fixed Vref level on the data buffer 222 of the memory die's I/O circuits 206. This die-side Vref is provided by a die adaptive Vref generator 234.

The die adaptive Vref generator 234 is preferably controlled by the memory controller 102 (see FIG. 1).

Figure 8:
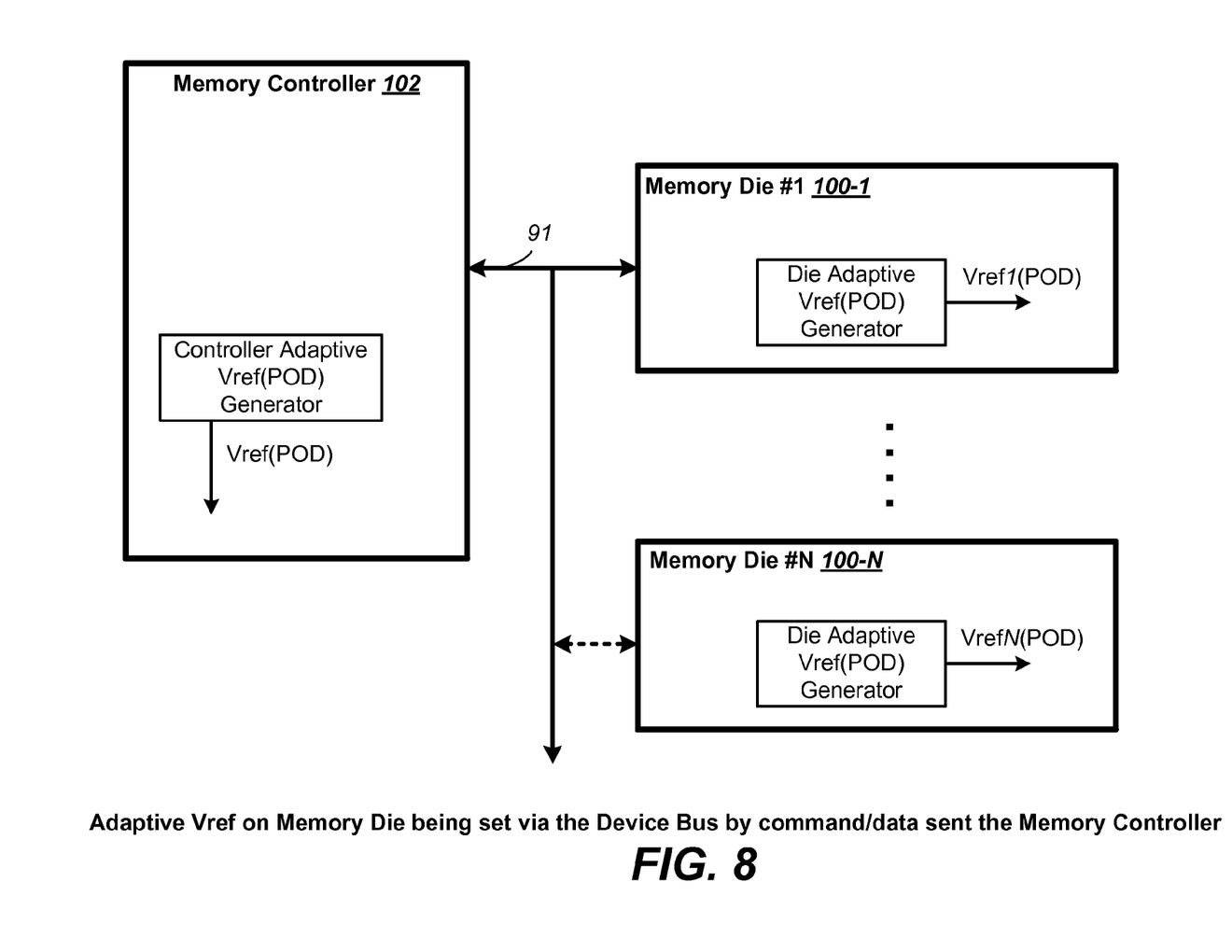
FIG. 8 illustrates another embodiment in which the data buffer on the memory die is optionally referenced with an adaptive Vref supplied by an adaptive Vref generator on the memory die as well.

FIG. 8 illustrates the memory controller communicating with the various memory dice to set their respective Vref generators. The memory controller 102 can control the Vref generators 234 on the memory dice to set a Vref level for each memory die 100 to reduce variations arising from N memory dice by using a SET feature. In this case, each adaptive Vref on the memory dice will have a tunable range. This is preferably accomplished by means of the existing command/data protocol between the memory controller and each memory die.

When the memory controller 102 is sending data to the memory die 100 (see FIG. 1) such as in a write operation, the data is being driven by the controller driver 110 via the device bus 91, 111 to the die receiver 222. Having on-chip termination with the POD scheme during memory write is easier to realize as termination on the memory die is linear and the off-chip driver (OCD) on the memory controller, fabricated in latest CMOS technology, has relatively linear drivers. On the other hand, when the memory die 100 is sending data to the memory controller 102 such as in a read operation, the data is being driven by the memory die's driver 210 via the device bus to the controller receiver 120. Having on-chip termination with the POD scheme during memory read would lead to variations in the low swing of the output voltage VoL due to the memory driver's 210 nonlinearity. The level in VoL(POD) (see Equation (6a) varies and is dependent on Vccq and temperature. The variation in VoL level is handled by an adaptive Vref(POD) 434 applied to the data buffer 430 of the controller I/O circuits 106, which seeks to be positioned at midlevel between Vccq and VoL. This will ensure the best signal-to-noise ratio for both "1" and "0" data.

Figure 9:
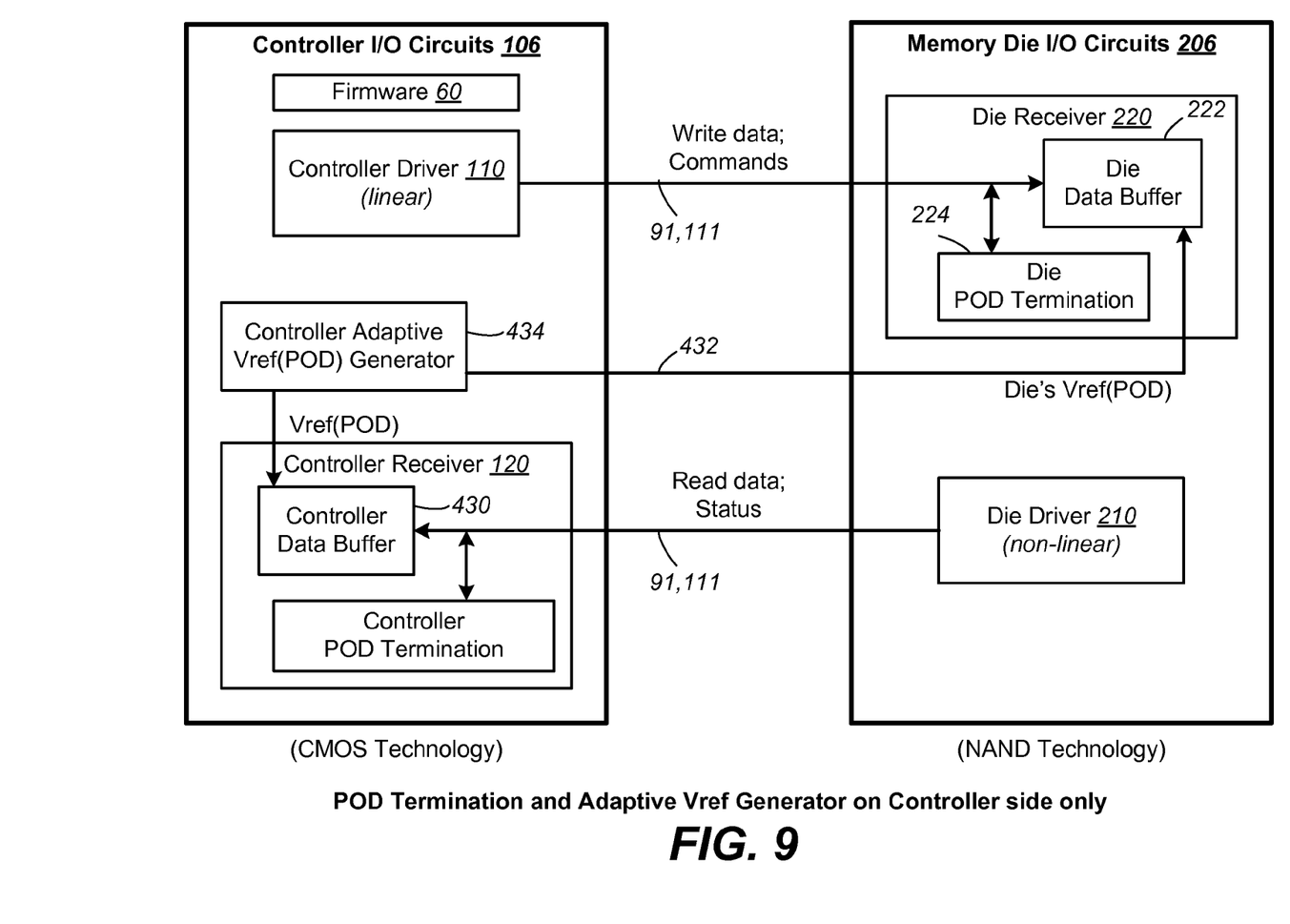
FIG. 9 illustrates one embodiment in which the adaptive Vref(POD) is supplied by an adaptive Vref(POD) generator that is preferably implemented in the memory controller.

FIG. 9 illustrates another embodiment in which all the adaptive Vref(POD) employed in the controller or in the memory dice are supplied by an adaptive Vref(POD) generator 434 that is preferably implemented in the memory controller 106.

On power-up of the memory device, the memory controller 106 under firmware performs calibration on each or a sample of the memory dice based on test runs of the I/O channel and determine the Vref(POD) based on the midlevel of Vccq and VoL or on optimal signal-to-noise ratio of the signals output from the data buffer. The Vref(POD) generator is then instructed to generate the appropriate Vref(POD) to be referenced by the controller data buffer 430 as well as the data buffer 222 of the memory dice.

In another embodiment, the adaptive Vref(POD) generator is made to output a Vref(POD) selected from a set of predetermined values based on the actual value of a=Rtt/Ron'.

In yet another embodiment, the adaptive Vref(POD) generator is made to select a default Vref(POD) which is an optimum value based on power-saving (smaller a=Rtt/Ron') while satisfying device and protocol specifications which places constraints on Rtt and Ron. It has been found that a preferred default value for a=Rtt/Ron'=1.5 and for Vref(POD)~0.7Vccq to 0.75Vccq.

The following tables illustrate some typical values for Ron and Rtt as supported by current NAND I/O as per TM400 or ONFI3 memory standards specifications.

TABLE 1

OCD drive strength

| Standards | Ron' (ohm) |
|---|---|
| OD1 | 25 |
| NOM | 35 |
| UD1 | 50 |
| UD2 | 100 |

TABLE 2

Terminations values supported on NAND memory

| CTT Rtt (ohm) | POD Rtt (ohm) |
|---|---|
| 50 | 100 |
| 75 | 150 |
| 100 | 200 |
| 150 | 300 |

Power Reduction with POD Terminations

As described in Equation (3), there is significant power reduction with POD termination compared to CTT terminations. For example, in memory write operation, the reduction in Iccq can amount to approximately 20% with a=2; Rtt=100 ohm and Ron=50 ohm. NAND Write has limited combinations as lowest Rtt=100 ohm for Vccq termination. So power saving is less compared to NAND Read. If lower Rtt is supported, Iccq can be reduced further.

However, when more than one NAND memory die, the effective termination resistance Rtt will be lower. For example, if two NAND dice are enabled to have POD termination, their individual Rtt will be combined in parallel, giving an effective Rtt of half that of a single die termination. If a single die termination is 100 ohm, then a two-die POD termination will have an effective Rtt=50 ohm. As can be seen from Equation (3) that the smaller is "a=Rtt/Ron", the more is the power saving.

In memory read operation, the reduction in Iccq can amount to approximately 26% with a=1.4; Rtt=50 ohm, Ron=35 ohm.

The power reduction depends on a=Rtt/Ron ratio and the available values of Ron and Rtt. Acceptable values are given by Tables 1 and 2 per TM400 or ONFI3 memory standards specifications.

Further Power Reduction with Bus Inversion

Since the POD termination only consume power for "0" data, to save more power, by appropriate coding, the numbers of "0" can be reduced thereby saving more power. I/O power can be reduced by 26-36% compared with CTT with bus inversion. No power saving for Clock signals (DQS/BDQS) due to bus inversion as activity=1 to clock. No power saving with bus inversion for data/clock in case of CCT as DC current is consumed for both data "1" and "0". It can be shown that Iccq reduction due to bus inversion to minimize the number of "0" for POD compared to CTT is:

$$\Delta Iccq(POD\_BI)=(1+0.34a)/(2a+1) \quad \text{Equation (8)}$$

Compatibility with Legacy Memory

Figure 10A:
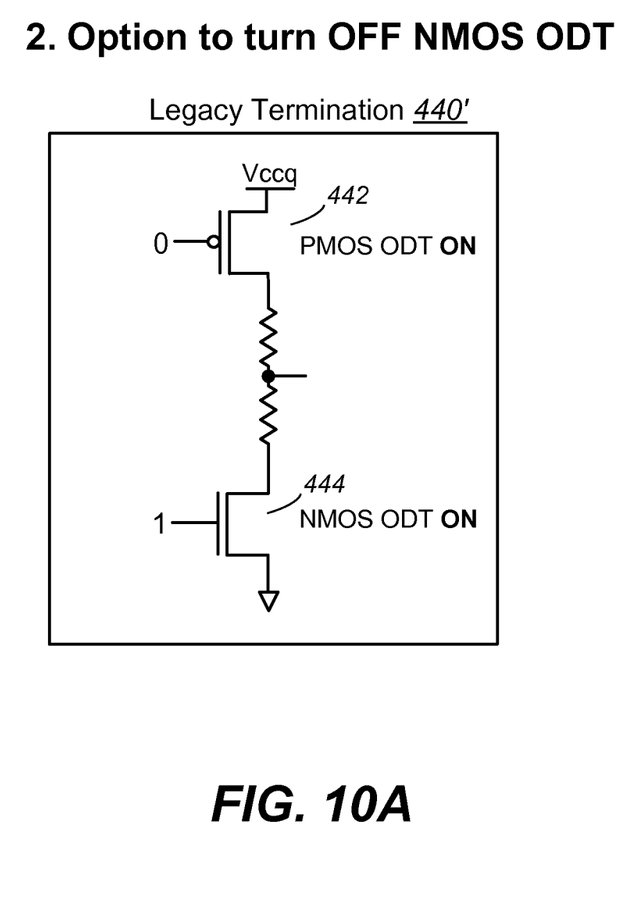
FIG. 10A illustrates implementing POD terminations in an existing memory device.

FIG. 10A illustrates implementing POD terminations in an existing memory device. An existing memory device has its on-chip termination 440' implemented by a pair of PMOS 442 and NMOS 444 transistor operating in complementary mode and using CTT termination.

Figure 10B:
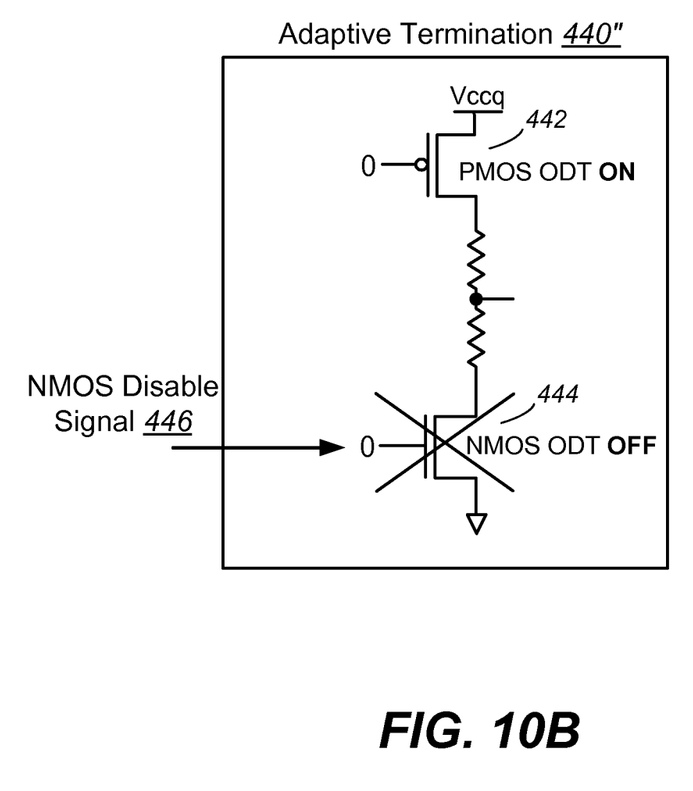
FIG. 10B illustrates an adaptive termination that can adaptively operate in legacy mode or in POD mode.

FIG. 10B illustrates an adaptive termination that can adaptively operate in legacy mode or in POD mode. Essentially, the legacy memory devices is converted to an adaptive termination 440" with a control signal 446 to enable or disable an option to turn off the NMOS transistor using a SET feature of the protocol for command and data between the controller and the memory die.

Option to Enable POD Termination Only During Transfer of Data and not During Command/Address/Status Option is provided to switch to adaptive Vref (POD) only during data transfer with termination. During CMD/ADDR or other un-terminated modes, the internal Vref=0.5*Vccq will be used. If timing is not compromised in the slower CMD/ADDR or other un-terminated modes by using Vref (POD) then it is preferable to use the same Vref(POD) for both terminated and un-terminated modes.

Figure 11A:
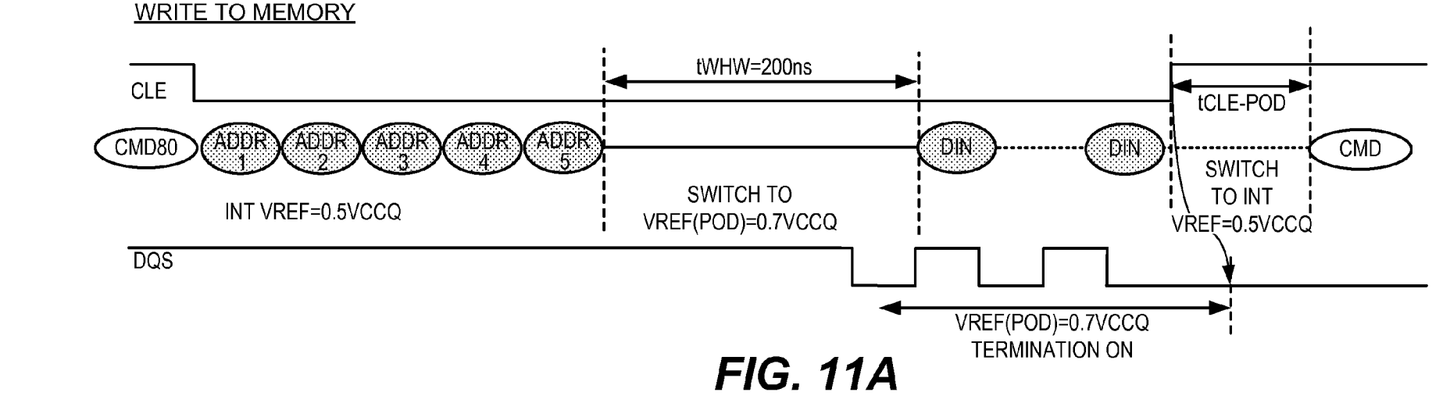
FIG. 11A is a timing diagram illustrating the time to switch from internal Vref to Vref(POD) during a write to memory operation.

FIG. 11A is a timing diagram illustrating the time to switch from internal Vref to Vref(POD) during a write to memory operation. This is the case when CMD/ADDR or other un-terminated modes need to switch from Vref(POD) (e.g., =0.7Vccq) to use Vref=0.5Vccq. Depending on Vref switching time, the timing specification of tWHW/tWHR and new tCLE-POD will need to be relaxed.

Figure 11B:
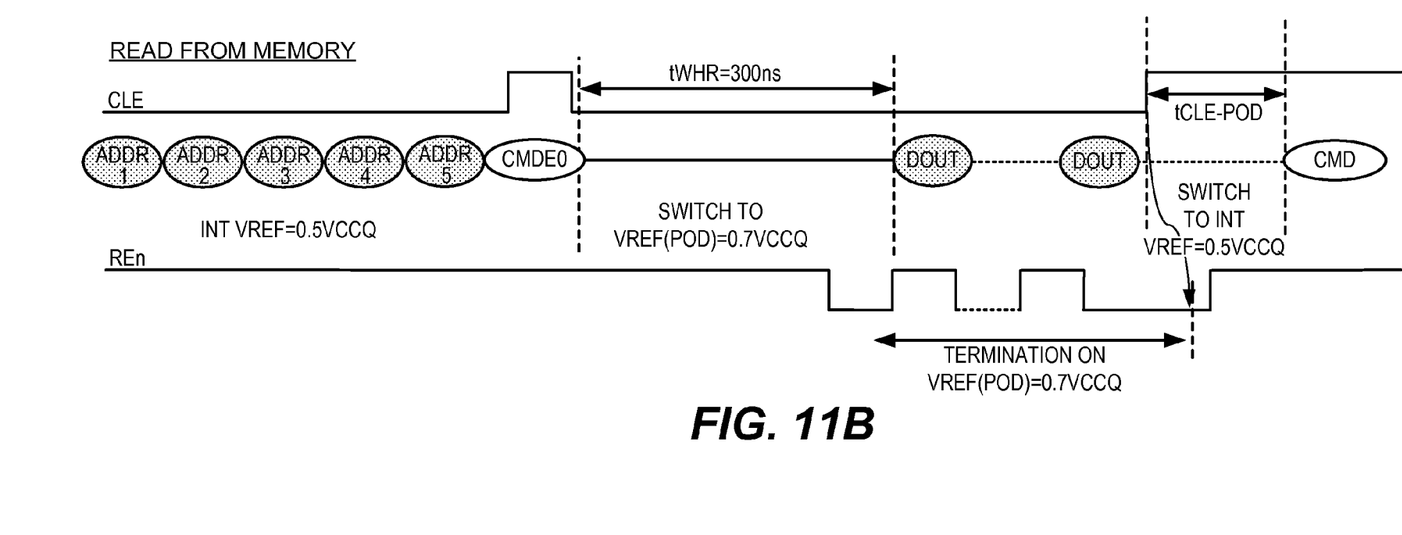
FIG. 11B is a timing diagram illustrating the time to switch from internal Vref to Vref(POD) during a read from memory operation.

FIG. 11B is a timing diagram illustrating the time to switch from internal Vref to Vref(POD) during a read from memory operation.

Conclusion

Although the various aspects of the present invention have been described with respect to exemplary embodiments thereof, it will be understood that the present invention is entitled to protection within the full scope of the appended claims.

It is claimed:

1. A non-volatile memory device, comprising:
an I/O channel for transporting data between first and second endpoints in the non-volatile memory device;
a driver having a resistance ("Ron") for driving data from the first endpoint through said I/O channel; and
a receiver for receiving the data at the second endpoint through said I/O channel;
said receiver further comprising:
a termination circuit at the second endpoint having a pseudo open drain (POD) configuration with the second endpoint being shunt only by a first termination resistor ("Rtt") to the supply voltage ("VDD") such that a current flow in the I/O channel only when the data is driven by a transistor of said driver to ground; and
a buffer circuit for buffering the data at the second endpoint, said buffer circuit being an operational amplifier for amplifying the data at the second endpoint relative to a reference voltage given by VDD/2 but adjusted by a predetermined $\Delta V$, said $\Delta V$ being a function of a ratio, (Rtt/Ron), between the resistance of the first termination resistor and the transistor of said driver.

2. The non-volatile memory device as in claim 1, further comprising:
an adaptive reference level generator for providing the reference voltage.

3. The non-volatile memory device as in claim 1, wherein:
said predetermined $\Delta V$ is given by [Ron/(Ron+Rtt)]Vccq/2.

4. The non-volatile memory device as in claim 1, wherein:
said driver having first and second drive transistors driving the data to a supply voltage ("VDD") and to ground (0V) respectively.

5. The non-volatile memory device as in claim 1, wherein:
said termination circuit at the second endpoint further comprises:
a second termination resistor shunting the second endpoint to ground; and
said second termination resistor is implemented by a termination transistor which is enabled or disabled by a control signal.

6. The non-volatile memory device as in claim 5, wherein:
said termination circuit is controllably changed from a POD configuration to a Center-Tap Termination ("CTT") configuration in response to the control signal enabling the termination transistor.

7. The non-volatile memory device as in claim 1, farther comprising:
a memory die containing a memory array;
a controller chip for controlling operations of the memory die; and
said I/O channel is established between the memory die and the controller chip.

8. The non-volatile memory device as in claim 7, wherein:
said memory die is one out of a plurality of memory dice controlled by the controller chip.

9. The non-volatile memory device as in claim 7, wherein:
said memory die comprises NAND-type memory.

10. The non-volatile memory device as in claim 7, wherein:
said adaptive reference level generator to output said reference level is set by said controller chip.

11. The non-volatile memory device as in claim 7, wherein:
said adaptive reference level generator resides in the controller chip.

12. The non-volatile memory device as in claim 8, wherein:
said adaptive reference level generator resides in each of the memory dice.

13. The non-volatile memory device as in claim 10, wherein:
said reference level is determined by the controller in a setup mode in testing said I/O channel under a range of $\Delta V$ for a selected $\Delta V$ that provides optimal I/O performance in the I/O channel.

14. The non-volatile memory device as in claim 1, wherein:
the data in the I/O channel are encoded by bus inversion to minimize a bit value corresponding to the second transistor of said driver driving to ground to save energy.

15. A method for operating an I/O channel between first and second endpoints of a memory device, comprising:
providing a driver for driving data from the first endpoint through said I/O channel;
providing a data buffer and a termination circuit for receiving the data at the second endpoint;
operating said termination circuit in a pseudo open drain (POD) configuration with the second endpoint being shunt only by a first termination, resistor ("Rtt") to the supply voltage ("VDD") such that a current flow in the I/O channel only when the data is driven by a transistor of said driver to ground; and
buffering the data at the second endpoint with said buffer circuit, said buffer circuit being an operational amplifier for amplifying the data at the second endpoint relative to a reference voltage given by VDD/2 but adjusted by a predetermined $\Delta V$, said $\Delta V$ being a function of a ratio, (Rtt/Ron), between the resistance of the first termination resistor and the transistor of said driver.

16. The method as in claim 15, further comprising:
providing the reference voltage with an adaptive reference level generator.

17. The method as in claim 15, wherein:
said predetermined $\Delta v$ is given by [Ron/(Ron+Rtt)]Vccq/2.

18. The method as in claim. 15, wherein:
said driver having first and second drive transistors driving the data to a supply voltage ("VDD") and to ground (0V) respectively.

19. The method as in claim 15, wherein:
said termination circuit at the second endpoint further comprises:
a second termination resistor shunting the second endpoint to ground; and said second termination resistor is implemented by a termination transistor which is enabled or disabled by a control signal.

20. The method as in claim 19, further comprising:
controllably changing said termination circuit from a POD configuration to a Center-Tap Termination ("CTT") configuration in response to the control signal enabling the termination transistor.

21. The method as in claim 15, further comprising:
a memory die containing a memory array;
a controller chip for controlling operations of the memory die; and
said I/O channel is established between the memory die and the controller chip.

22. The method as in claim 21, wherein:
said. memory die is one out of a plurality of memory dice controlled by the controller chip.

23. The method as in claim 21, wherein:
said memory die comprises NAND-type memory.

24. The method as in claim 21, further comprising:
setting said adaptive reference level generator to output said reference level by said controller chip.

25. The method as in claim 21, wherein:
said adaptive reference level generator resides in the controller chip.

26. The method as in claim 22, wherein:
said adaptive reference level generator resides in each of the memory dice.

27. The method as in claim 21, further comprising:
determining said reference level by the controller in a setup mode in testing said I/O channel under a range of $\Delta V$ for a selected $\Delta V$ that provides optimal I/O performance in the I/O channel.

28. The method as in claim 15, wherein:
encoding the data in the I/O channel by bus inversion to minimize a bit value corresponding to the second transistor of said driver driving to ground to save energy.

* * * * *